(12) United States Patent
Uehara et al.

(10) Patent No.: US 8,712,360 B2
(45) Date of Patent: *Apr. 29, 2014

(54) SYSTEM AND TRANSCEIVER CLOCKING TO MINIMIZE REQUIRED NUMBER OF REFERENCE SOURCES IN MULTI-FUNCTION CELLULAR APPLICATIONS INCLUDING GPS

(71) Applicant: Marvell World Trade Ltd., St. Michael (BB)

(72) Inventors: Gregory Uehara, Kaneohe, HI (US); Alexander Zaslavsky, Petach Tikva (IL); Brian T. Brunn, Bee Cave, TX (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 14/021,339

(22) Filed: Sep. 9, 2013

(65) Prior Publication Data

US 2014/0011467 A1 Jan. 9, 2014

Related U.S. Application Data

(63) Continuation of application No. 13/664,309, filed on Oct. 30, 2012, now Pat. No. 8,532,600, which is a continuation of application No. 12/821,595, filed on Jun. 23, 2010, now Pat. No. 8,301,098.

(60) Provisional application No. 61/220,102, filed on Jun. 24, 2009.

(51) Int. Cl.
*H04B 1/06* (2006.01)
*H04B 7/00* (2006.01)

(52) U.S. Cl.
USPC .......... 455/260; 455/255; 455/256; 455/257; 455/258; 455/259; 455/192.1; 455/192.2; 455/192.3; 342/98; 342/100; 342/103; 342/199; 342/357.62; 342/357.64; 331/18; 331/34; 331/60

(58) Field of Classification Search
USPC .......... 455/255–265, 192.1–192.3; 342/98–103, 199, 357.62, 357.64, 342/357.75; 331/18, 34, 60
See application file for complete search history.

(56) References Cited

U.S. PATENT DOCUMENTS 5,841,396 A * 11/1998 Krasner .................. 342/357.75
6,400,314 B1 * 6/2002 Krasner .................. 342/357.75
(Continued)

FOREIGN PATENT DOCUMENTS

WO WO-01/050151 A1 7/2001

OTHER PUBLICATIONS

International Search Report dated Dec. 1, 2010 in reference to PCT/US2010/039759.

(Continued)

*Primary Examiner* — Tuan A Tran

(57) ABSTRACT

A system includes a first clock module, a global positioning system (GPS) module, a phase-locked loop (PLL) module, a cellular transceiver, and a baseband module. The first clock module generates a first clock reference. The GPS module operates in response to the first clock reference. The WLAN module operates in response to the first clock reference. The PLL module generates a second clock reference by performing automatic frequency correction (AFC) on the first clock reference in response to an AFC signal. The cellular transceiver receives radio frequency signals from a wireless medium and generates baseband signals in response to the received radio frequency signals. The baseband module receives the baseband signals, operates in response to a selected one of the first clock reference and the second clock reference, and generates the AFC signal in response to the baseband signals.

24 Claims, 7 Drawing Sheets

(56) References Cited

U.S. PATENT DOCUMENTS

| | | | |
|---|---|---|---|
| 6,697,016 B1* | 2/2004 | Voor et al. | 342/357.62 |
| 6,867,734 B2* | 3/2005 | Voor et al. | 342/357.64 |
| 6,954,508 B2* | 10/2005 | Kimura | 375/344 |
| 7,012,563 B1* | 3/2006 | Bustamante et al. | 342/357.62 |
| 7,046,977 B2* | 5/2006 | Khlat et al. | 455/260 |
| 7,062,240 B2* | 6/2006 | Ballantyne et al. | 455/182.1 |
| 7,647,033 B2* | 1/2010 | Uozumi et al. | 455/260 |
| 8,041,310 B2* | 10/2011 | Nilsson et al. | 455/76 |
| 2003/0214432 A1* | 11/2003 | Tawadrous et al. | 342/357.1 |
| 2003/0214436 A1 | 11/2003 | Voor et al. | |
| 2004/0214538 A1* | 10/2004 | Ballantyne et al. | 455/141 |
| 2007/0104298 A1 | 5/2007 | Filipovic et al. | |
| 2008/0274704 A1* | 11/2008 | Barzilay et al. | 455/76 |

OTHER PUBLICATIONS

Adrian Maxim, Noise and Spurious Tones Management Techniques for Multi-GHz RF-CMOS Frequency Synthesizers Operating in Large Mixed Analog-Digital SOCs, EURASIP Journal on Wireless Communications and Networking, May 4, 2006, pp. 1-26, vol. 2006, Hindawi Publishing Corporation.

* cited by examiner

SYSTEM AND TRANSCEIVER CLOCKING TO MINIMIZE REQUIRED NUMBER OF REFERENCE SOURCES IN MULTI-FUNCTION CELLULAR APPLICATIONS INCLUDING GPS

CROSS-REFERENCE TO RELATED APPLICATIONS

This is a continuation of U.S. patent application Ser. No. 13/664,309 (now U.S. Pat. No. 8,532,600), filed on Oct. 30, 2012, which is a continuation of U.S. patent application Ser. No. 12/821,595 (now U.S. Pat. No. 8,301,098), filed on Jun. 23, 2010, which claims the benefit of U.S. Provisional Application No. 61/220,102, filed on Jun. 24, 2009. The entire disclosures of the above applications are incorporated herein by reference.

FIELD

The present disclosure relates to multi-functional cellular applications, and more particularly to generation of clock references for multi-function cellular applications with global positioning systems.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Referring now to FIG. 1, a cellular application 50 requires accurate clock references for receivers associated with a cellular transceiver module 52 and a global positioning system (GPS) receiver module 54. The cellular transceiver module 52 receives a first clock reference $ClkIn_{XCVR}$ from a voltage controlled, temperature compensated crystal oscillator (VC-TCXO) clock module 60.

The cellular transceiver module 52 receives RF signals including reference tones or other signals bearing timing information via one or more antennas 53. The RF signals are downconverted to baseband. A baseband module 68 receives the downconverted signals and generates digital automatic frequency control (AFC) signals. The cellular transceiver module 52 includes a DAC 66 that converts the digital AFC signals to analog AFC signals for output to the VC-TCXO clock module 60. The VC-TCXO clock module 60 corrects the first clock reference $ClkIn_{XCVR}$ based on the analog AFC signals. The clock reference $ClkIn_{XCVR}$ is adjusted to compensate for Doppler, temperature, and other effects.

However, the GPS receiver module 54 cannot use the first clock reference since it cannot tolerate abrupt frequency changes that occur in the first clock reference $ClkIn_{XCVR}$ from the VC-TCXO clock module 60 during AFC correction. As a result, an additional TCXO clock module 58 is typically used to generate a second clock reference $ClkIn_{GPS}$ for the GPS receiver module 54. The second clock reference is not AFC-corrected. The TCXO clock module 58 is implemented in addition to the AFC-corrected VC-TCXO clock module 60 used for the cellular transceiver module 52.

Referring now to FIG. 2, a cellular application 75 includes a first clock module 77 that provides a first clock reference to a GPS receiver module 79. A second clock module 82 provides a second clock reference to a clock distribution module 80 of a cellular transceiver module 81. The clock distribution module 80 may include a buffer 84 to buffer the second clock reference before the second clock reference is received by an internal clock distribution module 86.

A receiver phase lock loop (RxPLL) module 94 receives the second clock reference from the clock distribution module 80. The RxPLL module 94 includes a phase frequency detector (PFD) 96 that detects a phase difference between the second clock reference and a third clock reference output by a divider 104. The PFD 96 outputs the phase difference to a charge pump 98. An output of the charge pump 98 is filtered by a low pass filter (LPF) 100 and then output to a voltage controlled oscillator (VCO) 102. The VCO 102 outputs a fourth clock reference to the divider 104, which divides the fourth clock reference by a value selected from a set of one or more integer values to generate the third clock reference.

A receiver module 109 includes a low noise amplifier (LNA) 110 that receives and amplifies a radio frequency (RF) input. A downconverter 112 downconverts the RF input signal to a baseband signal. A combination filter and programmable gain amplifier (PGA) 118 filters and amplifies the baseband signal.

A combination analog to digital converter (ADC) and digital signal processor (DSP) module 124 includes an ADC module 128 and a receiver DSP 130. The ADC module 128 converts the baseband signal, as filtered and amplified, to a digital baseband signal. The receiver DSP 130 performs digital signal processing on the digital baseband signal.

An output of the receiver DSP 130 is received by a digital interface module 134, which provides an interface between a baseband module 135 and the cellular transceiver module 81. The baseband module 135 performs baseband processing on the digital baseband signal. The baseband module 135 also receives a system clock (SYSCLOCK) from the internal clock distribution module 86 via a buffer 136.

The baseband module 135 includes an automatic frequency correction (AFC) module 137 that processed the digital baseband signal to recover frequency error of the second clock reference. The AFC module 137 generates a digital AFC signal to correct the frequency error. The digital AFC signal is output via the digital interface module 134 to a digital to analog converter (DAC) 140. The DAC 140 generates an analog AFC signal, which is output to the second clock module 82. The second clock module 82 corrects the second clock reference based on the analog AFC signal.

The adjustments made in response to the analog AFC signal may cause abrupt frequency or phase changes in the second clock reference. While the abrupt clock reference changes may be acceptable to the cellular transceiver module 81, the changes are not acceptable to the GPS receiver module 79. As a result, both the first clock module 77 and the second clock module 82 is implemented.

SUMMARY

A system comprises a first clock module configured to generate a first clock reference that is not corrected using automatic frequency correction (AFC). A global position system (GPS) module is configured to receive the first clock reference. An integrated circuit for a cellular transceiver includes a system phase lock loop configured to receive the first clock reference, to perform AFC, and to generate a second clock reference that is AFC corrected.

In other features, the integrated circuit further comprises a receiver module configured to receive analog radio frequency (RF) signals and to output digital baseband signals. The receiver module includes at least one of a receiver digital signal processor and an analog to digital converter configured to receive one of a second clock reference and a third clock reference based on the second clock reference. A transmitter module is configured to receive digital baseband signals and to output analog transmit RF signals. The transmitter module includes at least one of a transmitter digital signal processor and a digital to analog converter configured to receive one of a second clock reference and a fourth clock reference based on the second clock reference.

In other features, the integrated circuit is configured to receive the first clock reference from the first clock module and to output the first clock reference to the GPS module. The integrated circuit further comprises a receiver phase lock loop module configured to receive the first clock reference and to generate a third clock reference based on the first clock reference. A transmitter phase lock loop module is configured to receive the first clock reference and to generate a fourth clock reference based on the first clock reference.

In other features, the receiver module further includes a downconverter configured to receive the third clock reference. The transmitter module further includes an upconverter configured to receive the fourth clock reference. The integrated circuit comprises a receiver phase lock loop module configured to receive the second clock reference and to generate a third clock reference based on the second clock reference. A transmitter phase lock loop module is configured to receive the second clock reference and to generate a fourth clock reference based on the second clock reference.

In other features, the receiver module further includes a downconverter configured to receive the third clock reference. The transmitter module further includes an upconverter configured to receive the fourth clock reference. A baseband module is configured to receive the digital baseband signals from the integrated circuit and to generate AFC signals. The baseband module is implemented by a second integrated circuit.

In other features, a multiplexer is configured to selectively output one of the first clock reference and the second clock reference to the baseband module. At least one of a WiFi module and a Bluetooth module is configured to receive the first clock reference from the integrated circuit.

The system phase lock loop includes a phase frequency detector configured to determine a difference between the first clock reference and a third clock reference. A charge pump is configured to receive an output of the phase frequency detector. A filter is configured to filter an output of the charge pump. A voltage controlled oscillator is configured to generate the second clock reference. A divider is configured to receive the second clock reference and to output the third clock reference based on a divisor. A fractional adjusting module is configured to adjust a ratio of the divisor between two or more integer values during successive intervals.

In other features, the voltage controlled oscillator comprises one of a ring oscillator, relaxation oscillator, and an LC oscillator. The first clock module comprises a temperature controlled crystal oscillator.

A method comprises generating a first clock reference that is not corrected using automatic frequency correction (AFC); receiving the first clock reference at a global position system (GPS) module; receiving the first clock reference at an integrated circuit for a cellular transceiver; and performing AFC using the integrated circuit and generating a second clock reference that is AFC corrected.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Figure 1:
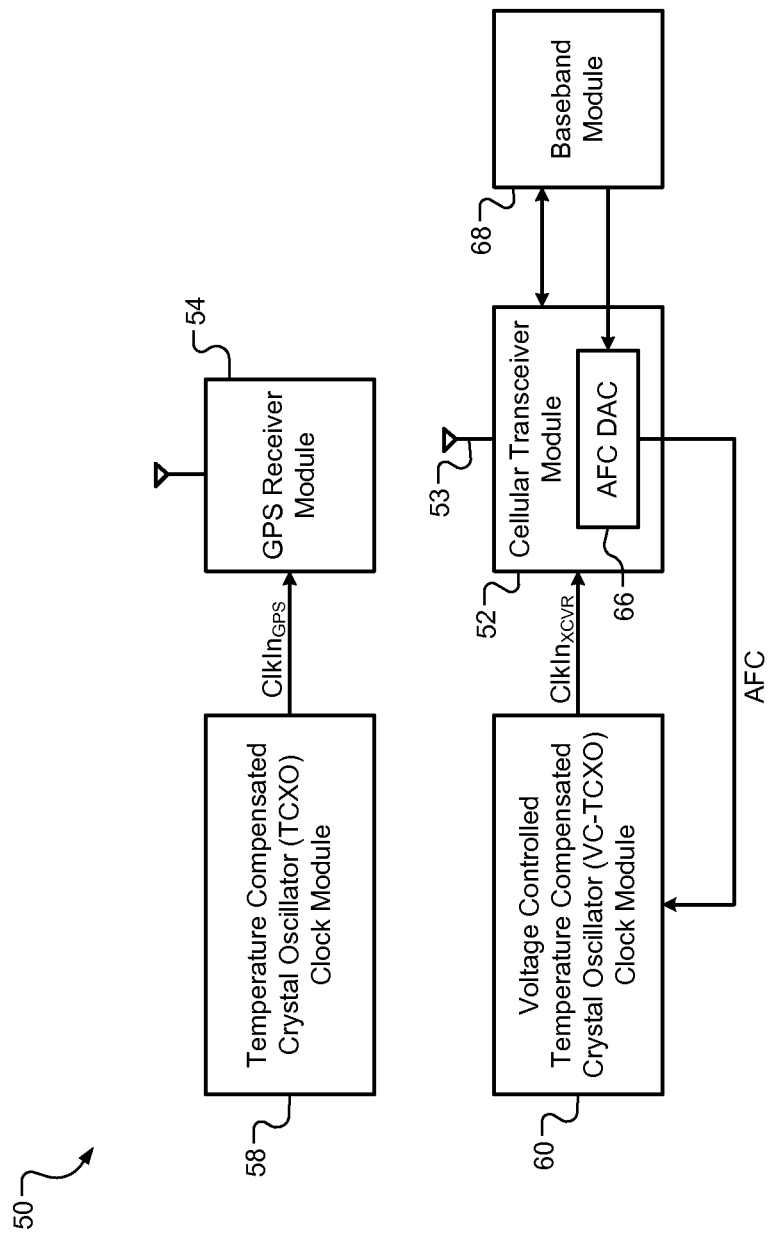
FIG. 1 is a simplified functional block diagram of a cellular application including a cellular transceiver and a global positioning system according to the prior art.
Figure 2:
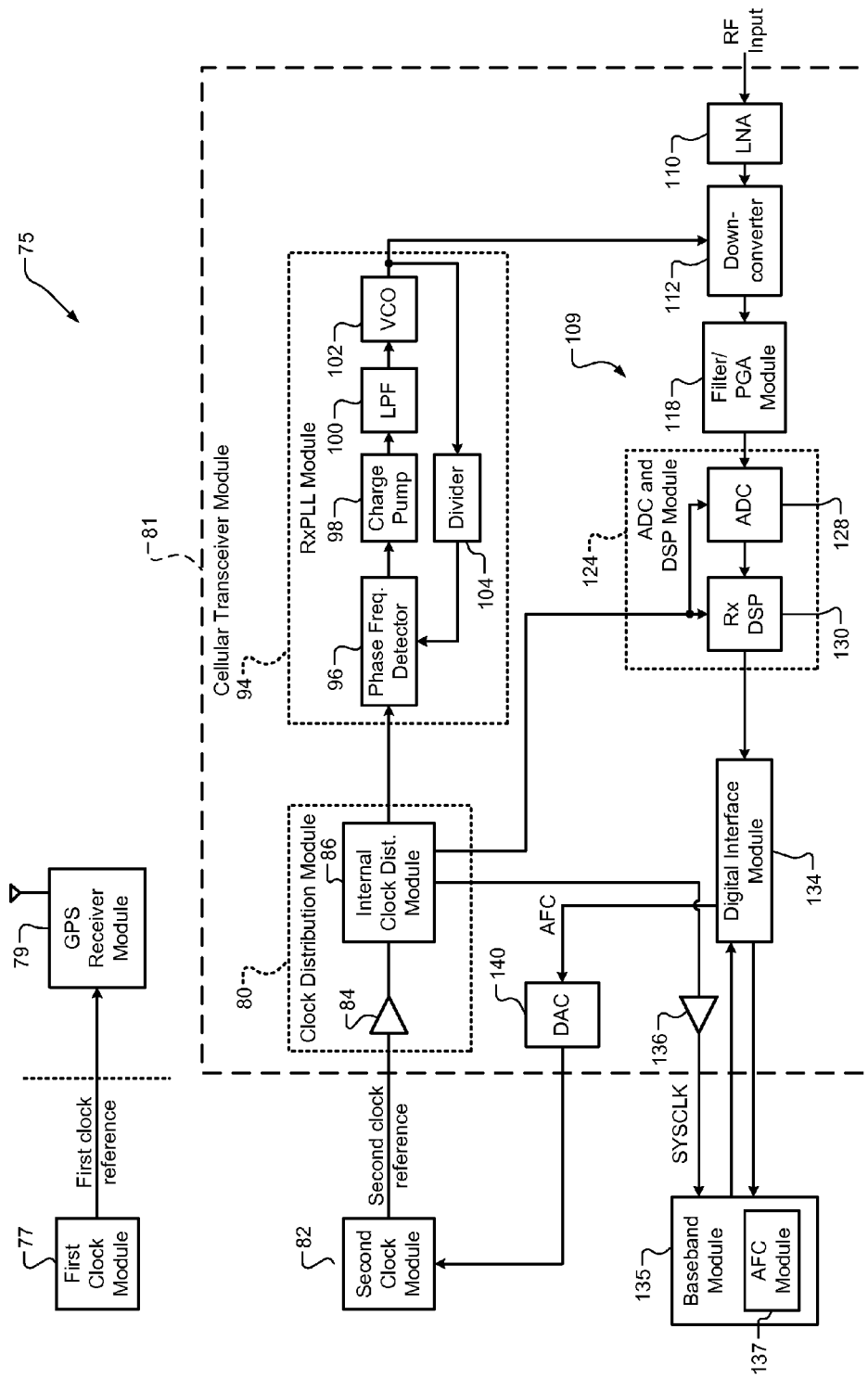
FIG. 2 is a more detailed functional block diagram of a cellular application including a cellular transceiver and a global positioning system according to the prior art.

The following description is merely illustrative in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

A multi-functional cellular device according to the present disclosure includes a cellular transceiver module and a global positioning system (GPS) receiver module that share a clock reference. The clock reference can also be shared with other modules of the multi-functional cellular device. As a result, the overall cost of the multi-functional cellular device can be reduced.

For example only, one multi-functional cellular device according to the present disclosure uses a single temperature compensated crystal oscillator (TCXO) clock module that has a temperature drift suitable for the GPS receiver. A clock reference from the TCXO clock module is input to the cellular transceiver. The cellular transceiver uses the clock reference internally and also buffers and outputs the clock reference to drive the GPS receiver. The TCXO clock module itself does not implement automatic frequency control (AFC). Therefore, the clock reference does not exhibit abrupt changes due to AFC, which would affect GPS performance. The cellular transceiver, meanwhile, performs AFC to generate a version of the clock reference that is used internally.

Figure 3:
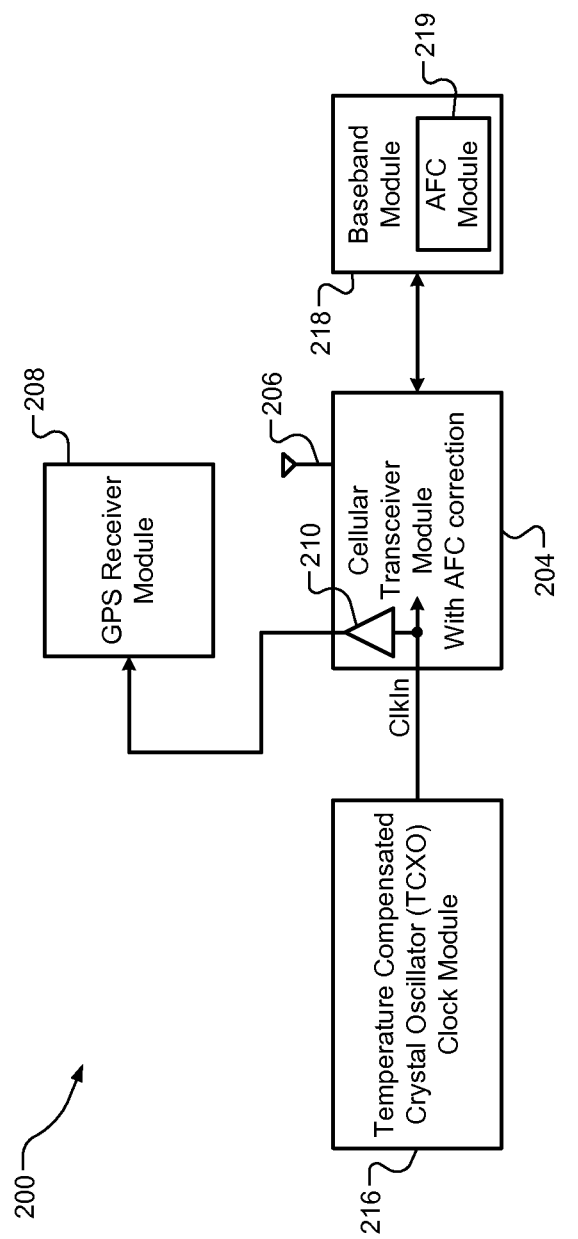
FIG. 3 is a simplified functional block diagram of a cellular application including a cellular transceiver and a global positioning system according to the present disclosure.

Referring now to FIG. 3, a multi-functional cellular device 200 includes a cellular transceiver module 204 with AFC correction and a global positioning system (GPS) receiver module 208. A clock module 216 generates a clock reference ClkIn for the cellular transceiver module 204. The clock module 216 may include a temperature compensated crystal oscillator (TCXO), although other types of clock modules may be used. The cellular transceiver module 204 includes a buffer 210 that outputs the clock reference to the GPS receiver module 208.

The cellular transceiver module 204 downconverts the received signal to baseband and outputs the baseband signal to a baseband module 218. The baseband module includes an AFC module 219 that recovers frequency error by processing the baseband signal and generates automatic frequency correction (AFC) signals. The AFC signals are then transmitted to the cellular transceiver module 204. The clock module 216 internally generates one or more additional clock references that are AFC corrected, as will be described further below.

Figure 4:
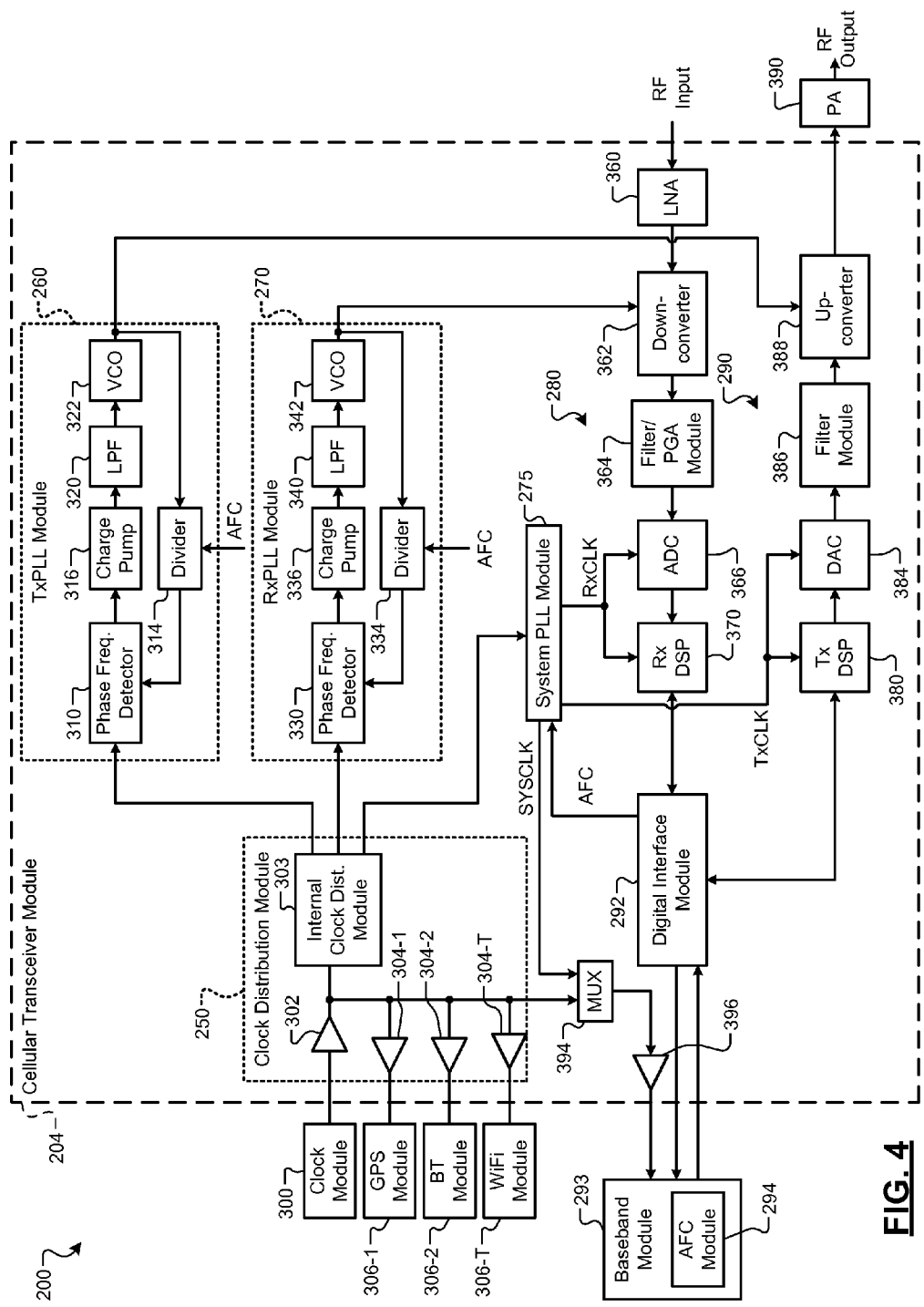
FIG. 4 is a more detailed functional block diagram of a cellular application including a cellular transceiver and a global positioning system according to the present disclosure.

Referring now to FIG. 4, an implementation of the cellular device 200 is shown. The cellular device 200 includes an implementation of the cellular transceiver module 204, which includes a clock distribution module 250, a transmitter phase lock loop (TxPLL) module 260, a receiver phase lock loop (RxPLL) module 270, a system phase lock loop (PLL) module 275, a receiver module 280, and a transmitter module 290. The cellular transceiver module 204 further includes a digital interface module 292 that provides an interface between a baseband module 293 and the cellular transceiver module 204. One or more of the clock distribution module 250, the TxPLL module 260, the RxPLL module 270, the system PLL module 275, the receiver module 280, the transmitter module 290, and the digital interface module 292 may be implemented as a first integrated circuit.

The baseband module 293 includes an AFC module 294 that generates AFC signals based digital processing of the received baseband signals. The baseband module 293 may be implemented as a second integrated circuit, which may be separate from the first integrated circuit.

A clock module 300 transmits a clock reference via a buffer 302 to an internal clock distribution module 303. In some implementations, the clock module 300 may include a temperature controlled crystal oscillator (TCXO). An output of the buffer 302 is also output via one or more buffers 304-1, 304-2, . . . , and 304-T (collectively buffers 304) to other modules 306-1, 306-2, . . . , and 306-T (collectively modules 306). For example only, the modules 306 may be off chip and may include, for example only, a GPS module, a Bluetooth (BT) module, a wireless local area network (such as WiFi) module, and/or additional modules.

The internal clock distribution module 303 outputs the first clock reference to a phase frequency detector (PFD) 310 of the TxPLL module 260. The PFD 310 also receives an output of a divider 314. The PFD 310 detects a difference in phase between the clock reference and a second clock reference output from the divider 314. The PFD 310 generates difference signals that are output to a charge pump 316. An output of the charge pump is received by a filter 320, such as a low pass filter (LPF). An output of the filter 320 is received by a voltage controlled oscillator (VCO) 322. A third clock reference output by the VCO 322 is output to the divider 314. The divider 314, which may be an integer N or fractional N divider, generates the second clock reference based on the third clock reference from the VCO 322.

The internal clock distribution module 303 also outputs the first clock reference to a PFD 330 of the RxPLL module 270. The PFD 330 also receives a fourth clock reference output by a divider 334. The PFD 330 detects a difference in phase between the first clock reference and the fourth clock reference from the divider 334. The PFD 330 generates difference signals that are output to a charge pump 336. An output of the charge pump 336 is passed through a filter 340, which may be a low pass filter, and output to a VCO 342. The VCO 342 outputs a fifth clock reference to the divider 334. The divider 334, which may be an integer N or fractional N divider, generates the fourth clock reference based on the fifth clock reference from the VCO 342.

The internal clock distribution module 303 also outputs the first clock reference to the system PLL module 275. The system PLL module 275 generates a sixth clock reference with AFC correction, on which is based clock references for one or more of the receiver module 280, the transmitter module 290, and the baseband module 293.

The receiver module 280 includes a low noise amplifier (LNA) 360 that receives an RF input from a source such as an antenna. An output of the LNA 360 is input to a downconverter 362, which downconverts the signal to baseband. A filter/programmable gain amplifier (PGA) module 364 receives an output of the downconverter 362 and performs filtering and gain adjustment. An output of the filter/PGA module 364 is input to an analog to digital converter (ADC) 366, which converts the RF input to a digital RF signal. The output of the ADC 366 is input to a receiver digital signal processor (DSP) 370, which performs digital signal processing and outputs digital receive data to the digital interface module 292.

The transmitter module 290 receives digital transmit data from the digital interface module 292. A transmitter DSP 380 performs digital signal processing on the digital transmit data from the digital interface module 292 and outputs the processed digital data to a digital to analog converter 384. An analog output of the DAC 384 is input to a filter module 386. An output of the filter module 386 is input to an upconverter 388, which upconverts the signal to an RF signal. An output of the upconverter 388 is input to a power amplifier 390, which amplifies and outputs an amplified RF signal to an antenna (not shown). The power amplifier 390 may be located external to the cellular transceiver module 204.

A multiplexer 394 receives the first clock reference from the buffer 302 and an AFC-corrected clock reference SYSCLK from the system PLL module 275. The multiplexer 394 selects one of the first clock reference and the AFC-corrected clock reference to output to a buffer 396. The baseband module 293 receives the selected clock reference from the buffer 396.

Figure 5:
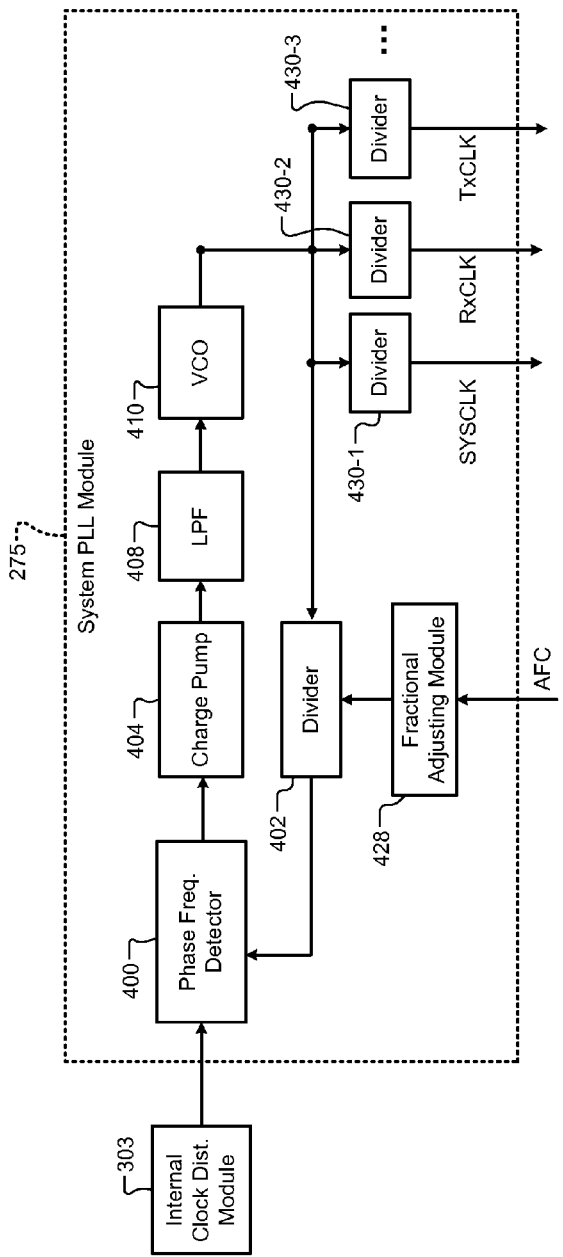
FIG. 5 is a functional block diagram of a system phase lock loop according to the present disclosure.

Referring now to FIG. 5, an implementation of the system PLL module 275 of FIG. 4 is shown in more detail. The system PLL module 275 includes a PFD 400 that detects a phase difference between the first clock reference from the internal clock distribution module 303 and a seventh clock reference from a divider 402. The PFD 400 outputs difference signals to a charge pump 404. An output of the charge pump 404 is filtered by a filter 408, which may be a low-pass filter (LPF). An output of the filter 408 is input to a VCO 410, which generates the sixth clock reference to be fed back to the divider 402. In various implementations, the sixth clock reference may also be output from the system PLL module 275.

The system PLL module 275 further includes a fractional adjusting module 428. The fractional adjusting module 428 adjusts an integer divisor of the divider 402 to vary the fractional frequency. For example only, the fractional adjusting module 428 may adjust the integer divisor of the divider 402 between two or more values during a repeating cycle of M successive clock cycles based on the AFC signals, where M is an integer greater than two. For example only, the fractional adjusting module 428 toggles the divider 402 between dividing by the two or more integer divisors during the M successive clock cycles to approximate fractional frequency division. Referring back to FIG. 4, the dividers 314 and 334 may also include fractional adjusting modules, receive the AFC signals and operate in a similar manner as the divider 402. In some implementations, fractional adjusting modules may receive the AFC and adjust the integer divisors of the dividers 314 and 334.

The system PLL module 275 may include one or more additional dividers 430-1, 430-2, 430-3, . . . (collectively dividers 430) that provide additional AFC corrected clock references at integer divisors of the sixth clock reference. For example only, two of the dividers 430 may generate AFC-corrected clock references RxCLK and TxCLK for the receiver module 280 and the transmitter module 290, respectively. In various implementations, the sixth clock reference may instead be output from the system PLL module 275 as one or more of the clock references RxCLK, TxCLK, and SYSCLK.

Figure 6:
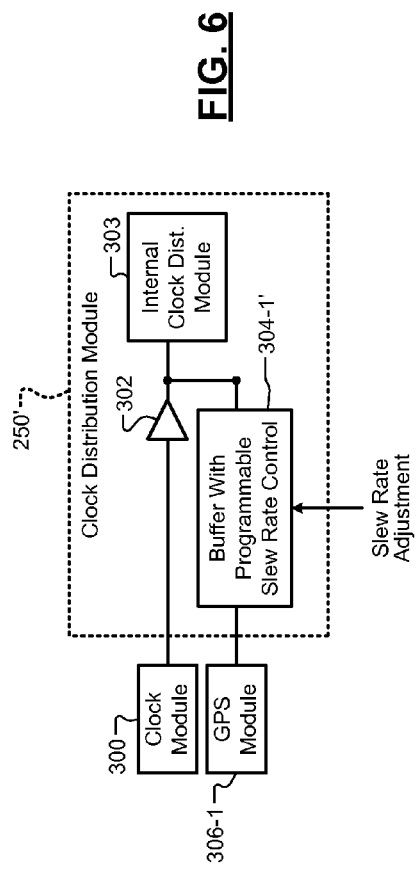
FIG. 6 is a functional block diagram of a buffer with programmable slew rate.

Various conventional methods may be used to reduce electromagnetic interference (EMI) due to substrate coupling, electrical coupling, magnetic coupling, etc. For example only, supply regulation and filtering may be used to reduce coupling through the supplies. For example only and referring now to FIG. 6, one or more of the buffers may be implemented as a buffer with programmable slew rate control. For example, the clock reference output by the buffer 302 may be supplied to a buffer 304-1' with programmable slew rate control. The slew rate of the buffer 304-1' may be adjusted by a slew rate adjustment signal. The slew rate adjustment signal may be generated externally, locally by the clock distribution module 250', externally by one or more of the other modules 306 (such as the GPS receiver module 306-1' in FIG. 6), by other components of the cellular transceiver, or in any other suitable manner. Controlling the slew rate in this manner tends to reduce EMI, spurs, etc. Other techniques for reducing EMI may be used depending upon implementation details of a particular application.

Figure 7:
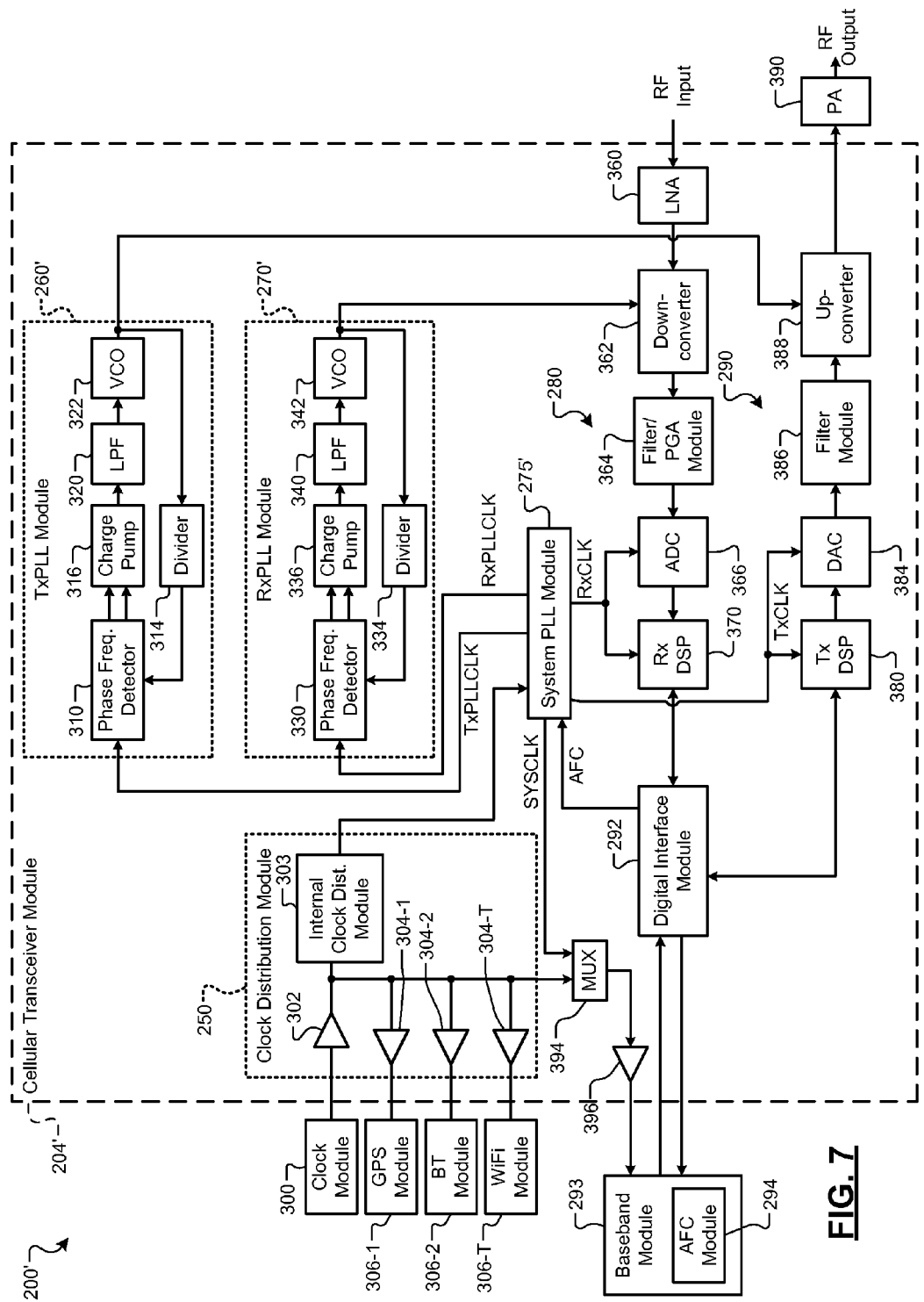
FIG. 7 is a more detailed functional block diagram of another cellular application including a cellular transceiver and a global positioning system according to the present disclosure.
Figure 8:
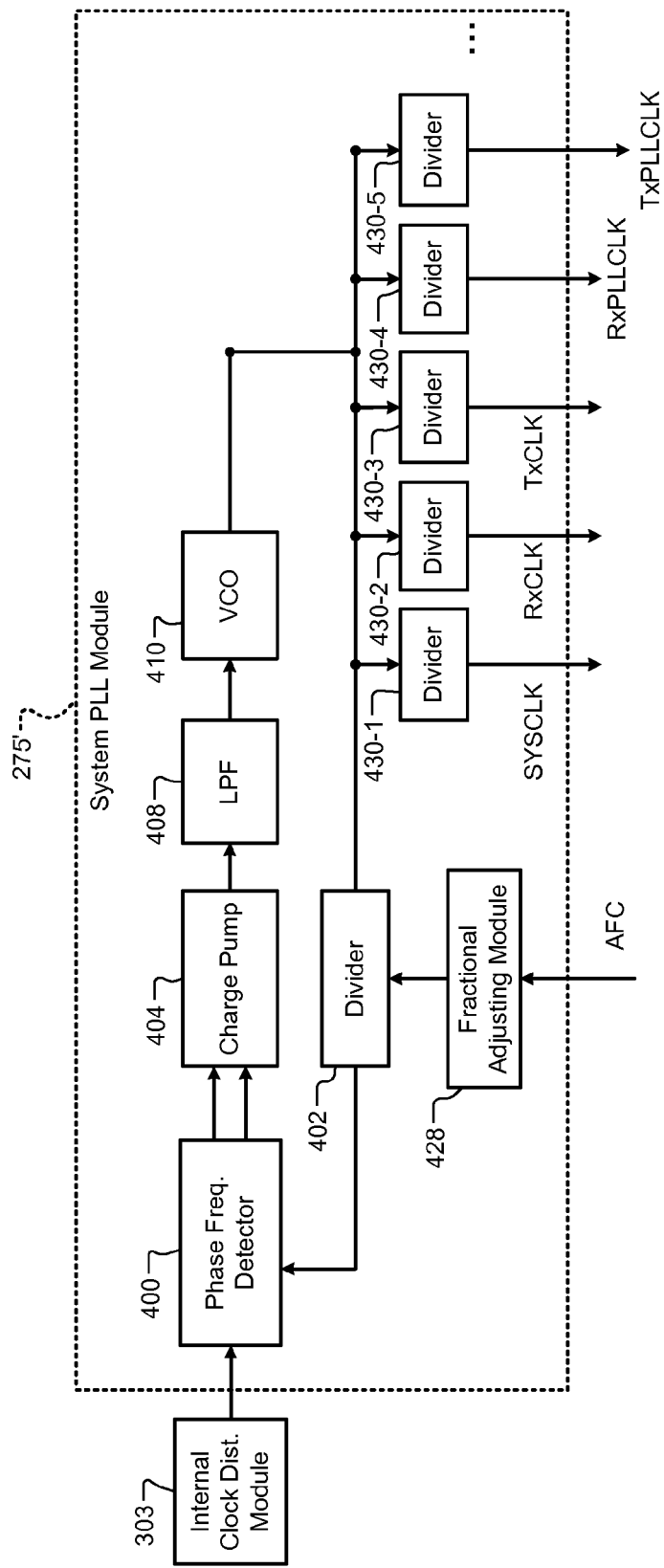
FIG. 8 is a functional block diagram of another system phase lock loop according to the present disclosure.

Referring now to FIGS. 7 and 8, another implementation of the cellular device 200' is shown. Similarities to previously described elements are indicated by using the same reference numeral with a prime (') symbol. In FIG. 7, AFC-corrected clock references are also output by the system PLL module 275' to the TxPLL module 260' and the RxPLL module 270'. In FIG. 8, additional dividers 430-4 and 430-5 may be provided to allow other integer divisors of the sixth clock reference output from the VCO 410. For example only, the dividers 430-4 and 430-5 may generate clock references TxPLLCLK and RxPLLCLK for the TxPLL and RxPLL modules 260' and 270', respectively.

Each of the VCOs described above may be implemented as a ring oscillator, a relaxation oscillator, an LC oscillator, and/or any other suitable oscillator. The WiFi module 306-T and the BT module 306-2 may comply with one or more of the following IEEE standards: 802.11, 802.11a, 802.11b, 802.11g, 802.11h, 802.11n, 802.16, 802.20, and 802.15.1.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A system comprising:
a clock module configured to generate a first clock reference;
a global positioning system (GPS) module configured to operate in response to the first clock reference;
a first module configured to, in response to an automatic frequency correction signal, (i) generate a second clock reference by performing automatic frequency correction on the first clock reference, and (ii) generate a third clock reference by performing automatic frequency correction on the first clock reference;
a second module configured to (i) receive radio frequency signals from a wireless medium, and (ii) in response to the third clock reference, generate baseband signals based on the received radio frequency signals; and
a third module configured to (i) receive the baseband signals, and (ii) in response to a selected one of the first clock reference and the second clock reference, generate the automatic frequency correction signal based on the baseband signals.

2. The system of claim 1, further comprising a wireless local area network (WLAN) module configured to operate in response to the first clock reference.

3. The system of claim 2, further comprising a clock distribution module configured to receive the first clock reference and distribute the first clock reference to the GPS module, the WLAN module, and the first module.

4. The system of claim 1, wherein the first module comprises a phase-locked loop (PLL) module configured to generate the second clock reference by performing automatic frequency correction on the first clock reference in response to the automatic frequency correction signal.

5. The system of claim 1, wherein the second module comprises a baseband module.

6. The system of claim 1, further comprising a selection module configured to (i) receive the first clock reference and the second clock reference, and (ii) output the selected one of the first clock reference and the second clock reference to the third module.

7. The system of claim 1, further comprising a wireless personal area network (WPAN) module configured to operate in response to the first clock reference.

8. The system of claim 7, wherein the WPAN module comprises a Bluetooth module.

9. The system of claim 7, further comprising a clock distribution module configured to receive the first clock reference and distribute the first clock reference to the GPS module, the first module, and the WPAN module.

10. The system of claim 1, wherein the first module comprises:
- a phase frequency detector configured to determine a difference between the first clock reference and an internal clock reference;
- a charge pump configured to receive an output of the phase frequency detector;
- a filter configured to filter an output of the charge pump;
- a voltage controlled oscillator configured to generate the second clock reference;
- a divider configured to (i) receive the second clock reference, and (ii) output the internal clock reference based on a divisor; and
- a fractional adjusting module configured to adjust a ratio of the divisor between two or more integer values during successive intervals.

11. The system of claim 1, wherein the third clock reference is a multiple of the second clock reference, the multiple being an integer greater than one.

12. The system of claim 1, wherein the second module comprises a receiver module configured to (i) operate in response to the third clock reference, (ii) receive the radio frequency signals, and (iii) output the baseband signals in response to the radio frequency signals, wherein the radio frequency signals comprise analog radio frequency signals, and wherein the baseband signals comprise digital baseband signals.

13. The system of claim 12, wherein the receiver module comprises:
- an analog to digital converter configured to (i) operate in response to the third clock reference, and (ii) generate digital signals in response to the radio frequency signals; and
- a receiver digital signal processor configured to (i) operate in response to the third clock reference, and (ii) generate the baseband signals in response to the digital signals from the analog to digital converter.

14. The system of claim 13, wherein the receiver module further comprises a downconverter configured to (i) operate in response to a fifth clock reference, and (ii) generate downconverted signals in response to the radio frequency signals, wherein the analog to digital converter generates the digital signals in response to the downconverted signals.

15. The system of claim 14, further comprising a receiver PLL module configured to generate the fifth clock reference in response to the first clock reference.

16. The system of claim 14, further comprising a receiver PLL module configured to generate the fifth clock reference in response to a seventh clock reference from the first module.

17. The system of claim 12, wherein the second module further comprises a transmitter module configured to (i) operate in response to a fourth clock reference, (ii) receive digital baseband transmit signals, and (iii) output analog radio frequency transmit signals in response to the digital baseband transmit signals.

18. The system of claim 17, wherein the first module is further configured to generate the fourth clock reference by performing automatic frequency correction on the first clock reference in response to the automatic frequency correction signal.

19. The system of claim 18, wherein the fourth clock reference is a second integer multiple of the second clock reference, the second integer being greater than or equal to one.

20. The system of claim 17, wherein the transmitter module comprises:
- a transmitter digital signal processor configured to (i) operate in response to the fourth clock reference, and (ii) generate intermediate digital signals in response to the digital baseband transmit signals; and
- a digital to analog converter configured to (i) operate in response to the fourth clock reference, and (ii) generate the analog radio frequency transmit signals in response to the intermediate digital signals from the transmitter digital signal processor.

21. The system of claim 20, wherein the transmitter module further comprises an upconverter configured to (i) operate in response to a sixth clock reference, and (ii) generate upconverted transmit signals in response to the analog radio frequency transmit signals.

22. The system of claim 21, further comprising a transmitter PLL module configured to generate the sixth clock reference in response to the first clock reference.

23. The system of claim 21, further comprising a transmitter PLL module configured to generate the sixth clock reference in response to an eighth clock reference from the first module.

24. The system of claim 1, wherein the clock module comprises a temperature-compensated crystal oscillator.

\* \* \* \* \*